(12) United States Patent
Lin

(10) Patent No.: US 7,830,721 B2
(45) Date of Patent: Nov. 9, 2010

(54) MEMORY AND READING METHOD THEREOF

(75) Inventor: Yung-Feng Lin, Taoyuan County (TW)

(73) Assignee: Macronix International Co., Ltd, Hsinchu (TW)

( * ) Notice: Subject to any disclaimer, the term of this patent is extended or adjusted under 35 U.S.C. 154(b) by 59 days.

(21) Appl. No.: 12/240,108

(22) Filed: Sep. 29, 2008

(65) Prior Publication Data
US 2010/0080067 A1    Apr. 1, 2010

(51) Int. Cl.
*G11C 11/34* (2006.01)
(52) U.S. Cl. .............................. 365/185.25; 365/185.24
(58) Field of Classification Search ............ 365/185.25, 365/185.24
See application file for complete search history.

(56) References Cited

U.S. PATENT DOCUMENTS 7,009,880 B1 *    3/2006   Liu ........................ 365/185.11
2005/0281108 A1 *   12/2005   Terzioglu et al. ............ 365/205

* cited by examiner

*Primary Examiner*—Michael T Tran
(74) *Attorney, Agent, or Firm*—Thomas, Kayden, Horstemeyer & Risley

(57) ABSTRACT

A reading method applied for a memory, which includes a cell row including a first memory cell coupled to a first bit line and a second memory cell coupled to a second bit line is provided. The reading method comprises the following steps. Firstly, the first bit line coupled to a first terminal of the first memory cell is selected for reading the first memory cell in a time period. Next, the second terminal of the first memory cell is discharged via the second bit line coupled to the second memory cell in the time period.

9 Claims, 5 Drawing Sheets

MEMORY AND READING METHOD THEREOF

BACKGROUND OF THE INVENTION

1. Field of the Invention

The invention relates in general to a reading method, and is more particularly capable of compensating the source-side loading effect in a memory.

2. Description of the Related Art

Referring to FIG. 1, a circuit diagram of a NOR type flash memory array is shown. The flash memory array 1 includes numerous flash memory cells, each of which includes a metal oxide semiconductor (MOS) transistor, arranged in rows and columns. In an example, those memory cells are arranged in M×N matrix, wherein M and N are natural numbers.

Memory cells on a same cell rows have gates connected to a corresponding word line among the WL1 to WLM, drains connected to the respective N bit lines BL1 to BLN, and sources connected to a corresponding source line among M source lines SL1 to SLM. When memory cells on each cell rows are read, the memory cells is driven by signals on the corresponding word lines WL1 to WLM and bit lines BL1 to BLN to provide output currents on the corresponding source lines SL1 to SLM. The source lines SL1 to SLM respectively have sensing nodes 131 to 131M, at which corresponding output currents are sensed to determine the data values stored in the corresponding memory cells.

Conventionally, the source lines SL1 to SLM are formed by implantation on silicon, which is a material with high unit resistance value. In an example, a segment of source line between any two neighboring bit lines associated with a unit source side resistance Rs. Thus, the source side loading effect will occurs at the conventional flash memory circuit 1 to lift up the source voltage of memory cells, cause variation in the threshold voltages of each memory cells and the sensed output current, and lead to faulty reading operation. In some cases, the source side loading effect can even causes the over-erasure situation to make memory cells over-erased due to the misjudgment of the varied sensed output current.

At some extremely operation example, such as page read operation, the current flowed on the source line is even higher than that in normal read operation. For example in page read operation, at least 64 sense amplifiers are used at the same time, but in normal read, 16 amplifiers are used. Thus, the source side loading effect will become even worse to cause permanent damage on the memory circuit. Therefore, how to determine a reading method to ease the source side loading effect has became a prominent goal to achieve.

SUMMARY OF THE INVENTION

The invention is directed to a reading method and a memory. In comparison with conventional memory, the reading method and the memory provided in the present embodiment can effectively ease the source side loading effect.

According to a first aspect of the present invention, a memory is provided. The memory comprises a memory array, first and second bit lines, and a discharge circuit. The memory array comprises first memory cell and second memory cell situated on a selected cell row of the memory array, wherein sources of the first and the second memory cells are connected to a diffusion ground path. The first and the second bit lines are respectively corresponding to the first and the second memory cells. When the first memory cell is read, the second bit line is selected to discharge a source side voltage of the first memory cell. The discharge circuit discharges first terminal of the first memory cell via the second bit line when the first memory cell is read.

According to a second aspect of the present invention, a reading method applied for a memory, which includes a cell row including a first memory cell coupled to a first bit line and a second memory cell coupled to a second bit line is provided. The reading method comprises the following steps. Firstly, the first bit line coupled to a first terminal of the first memory cell is selected for reading the first memory cell in a time period. Next, the second terminal of the first memory cell is discharged via the second bit line coupled to the second memory cell in the time period.

The invention will become apparent from the following detailed description of the preferred but non-limiting embodiments. The following description is made with reference to the accompanying drawings.

DETAILED DESCRIPTION OF THE INVENTION

The memory provided in the present embodiment of the invention provides a path, which includes another non-accessed memory cell and an idled bit line, to pull the voltage on source line to the ground voltage.

The memory of the present embodiment of the invention includes a memory array, a couple of bit lines, and a discharge circuit. The memory array includes first memory cell and second memory cell, which are respectively corresponds to first bit line and second bit line among those bit lines, situated on a selected cell row of the memory array. The sources of the first and the second memory cells are connected to a diffusion ground path. When the first memory cell is read, the discharge circuit discharges a source side voltage of the first memory cell.

Figure 1:
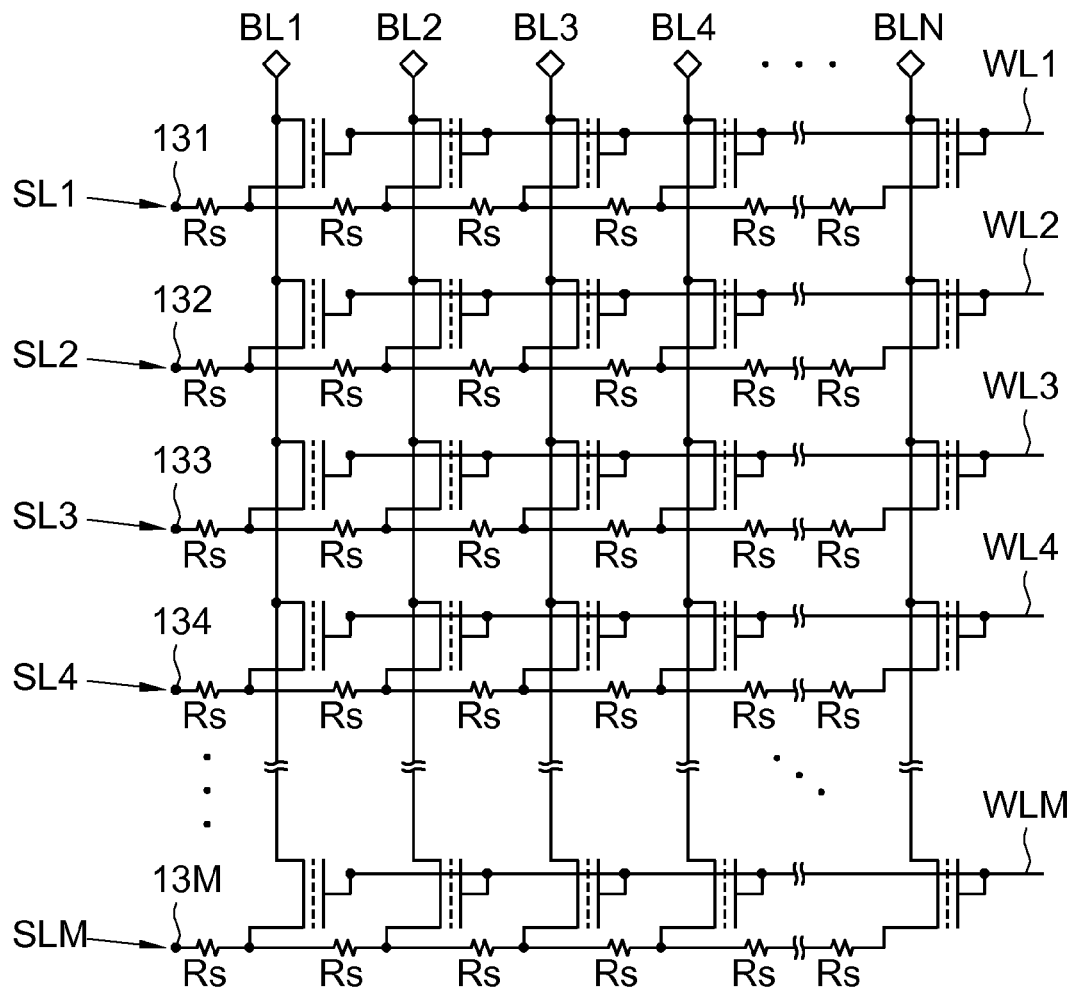
FIG. 1 (Prior Art) is a circuit diagram of a NOR type flash memory array.
Figure 2:
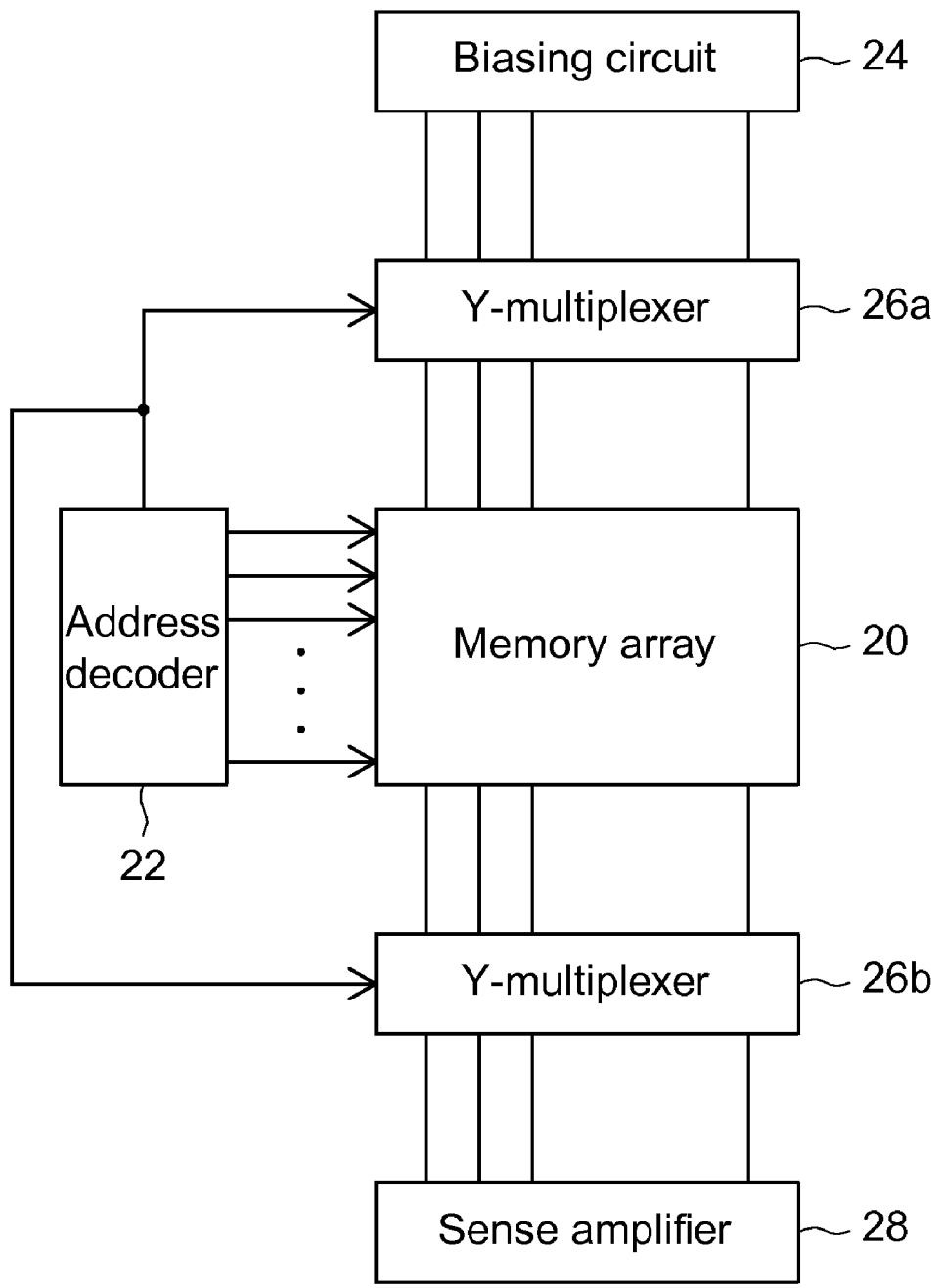
FIG. 2 is a schematic diagram of the memory of according to the embodiment.

Referring to FIG. 2, a schematic diagram of the memory of according to the embodiment is shown. The memory 2 includes a memory array 20, an address decoder 22, a biasing circuit 24, Y-multiplexers 26a, 26b, and sense amplifier 28. The memory array 20 is a NOR-type memory array, which includes J memory units, wherein J is a natural number. A number of diffusion ground paths are provided in each of the J memory units to provide a ground voltage to each and every memory cell therein. To be more specific, each and every memory cell in each of the J memory units includes a metal oxide semiconductor (MOS) transistor, wherein the ground voltage is provided to the source of the MOS transistor.

Each of the J memory units includes K memory blocks, wherein K is a natural number. In an example, K is exemplified to be 1. Since the operations performed on the memory units of the memory array 20 are similar, in the following paragraphs, only the operation performed on the $i^{th}$ memory unit MU_i among the J memory unit is cited as an example for further description.

Figure 3:
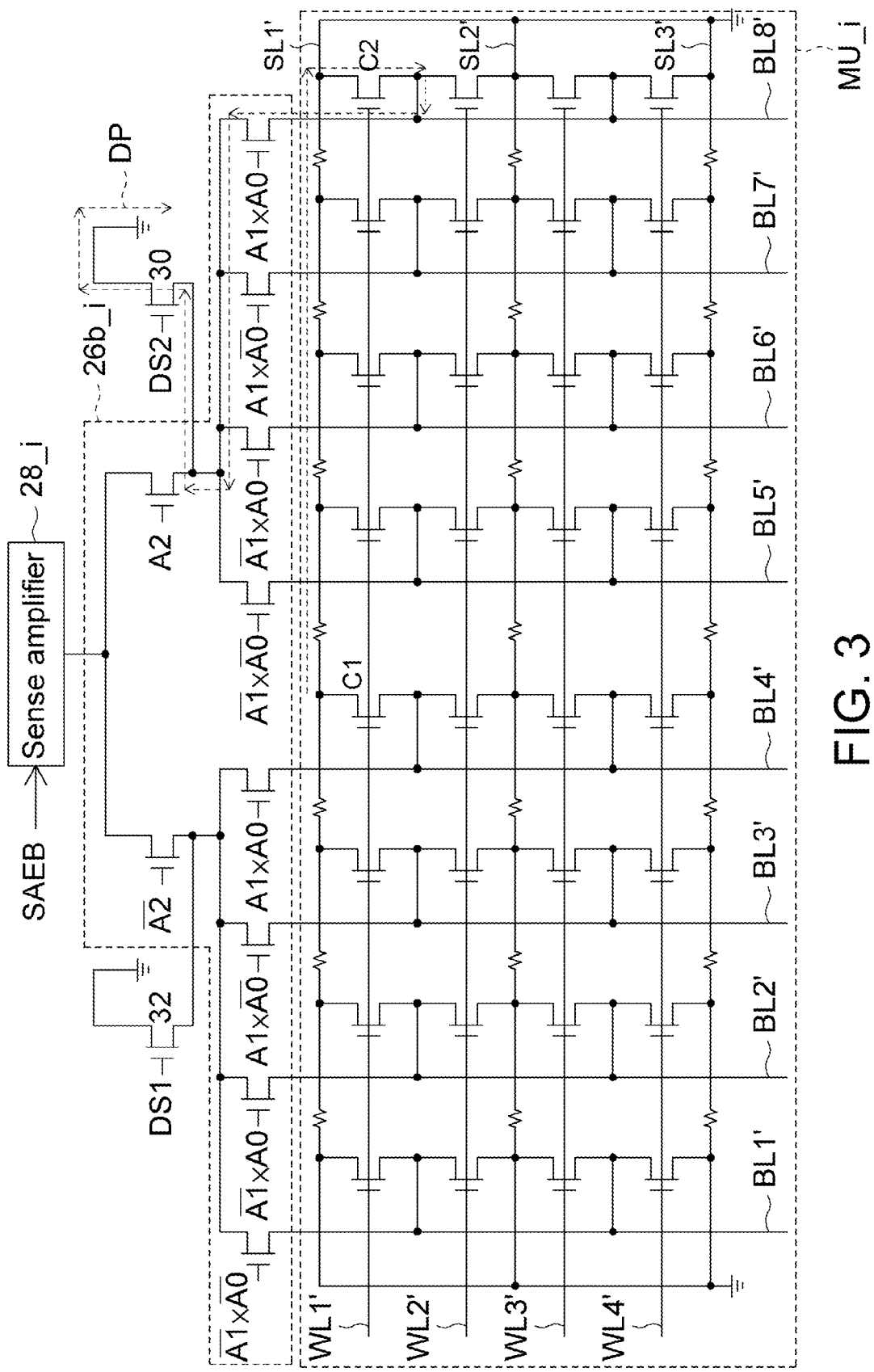
FIG. 3 is a schematic diagram of the $i^{th}$ memory unit MU_i of a memory array according to the embodiment.

Referring to FIG. 3, a schematic diagram of the $i^{th}$ memory unit MU_i of a memory array. As shown in FIG. 3, in an example, the memory unit MU_i includes a number of memory cells arranged in 4×8 matrix. The memory unit MU_i further includes word lines WL1' to WL4', bit lines BL1' to BL8', and source lines SL1' to SL3'.

The source lines SL1' to SL3' are diffusion ground paths. In an example, the memory unit MU_i is arranged uniformly, the same distance of source lines, which associated with a unit source side resistance value Rs, is presented between every two neighboring source ends of memory cells.

The source lines SL1' to SL3' are for providing ground voltage to the corresponding cell rows of the 4×8 matrix. The world lines WL1' to WL4' are used to provide corresponding row addresses to enable the corresponding cell rows. The bit lines BL1' to BL8' are selected by Y-multiplexer 26b__i to correspondingly output current provided by the memory cell on the enabled cell row and on the selected bit line to sense amplifier 28__i so as to sense the data stored in the corresponding memory cell.

In an example, the Y-multiplexer 26b__i selects the bit lines BL1' to BL8' in response to a selection signal, which includes bit data A1, A2, and A3, wherein the bit data {A3, A2, A1} decides 8 different values corresponding to the respective bit lines LB1' to BL8'. The Y-multiplexer 26b__i includes a number of transistors for connecting each of the bit lines BL1' to BL8' to the sense amplifier 28__i. For example, when the selection signal {A3, A2, A1} has the value of {0, 0, 0}, the bit line BL1' is selected.

In the present embodiment, discharge circuits 30 and 32 are also incorporated, as shown in FIG. 3, to discharge voltages on the bit lines BL1' to BL8' to a ground voltage in response to discharge signals DS1 and DS2. In an example, the discharge signals DS1 and DS2 are also provided by the address decoder 22 illustrated in FIG. 2.

Since read operations performed on each and every memory cells of the memory unit MU_i are similar, in the following paragraphs, a read operation performed on a memory cell C1 situated on the first cell row and fourth cell column of the memory unit MU_i is cited as an example for describing the operations performed on each and every memory cells of the memory unit MU_i.

Figure 4:
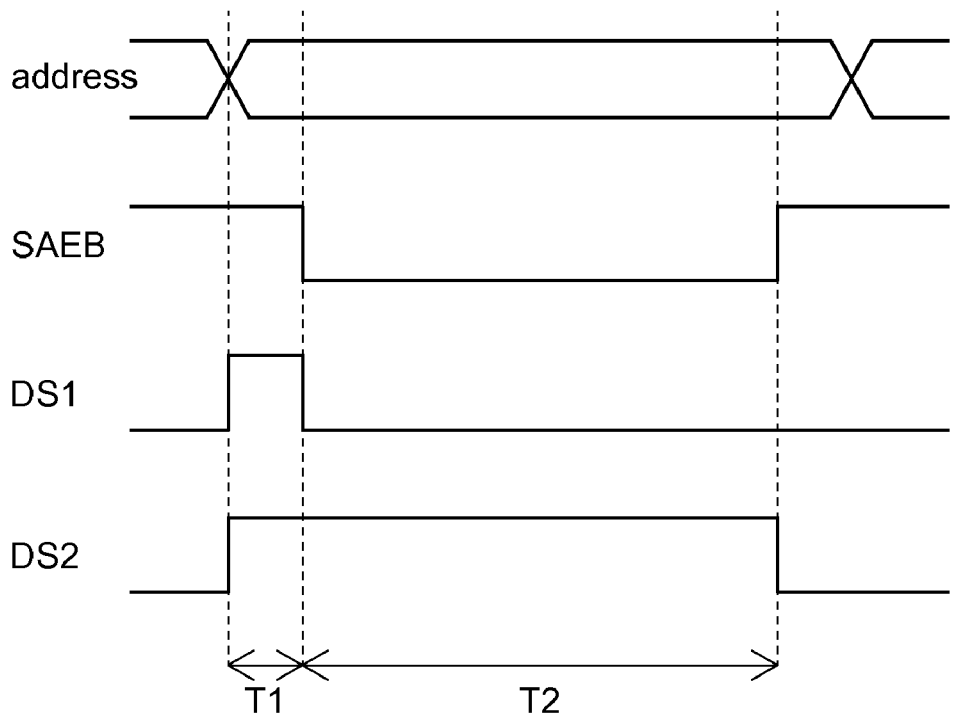
FIG. 4 is a wave form of the read operation performed on the memory unit MU_i illustrated in FIG. 3.

Referring to FIG. 4, a wave form of the read operation performed on the memory unit MU_i illustrated in FIG. 3 is shown. In a time interval T1, the sense amplifier 28__i is enabled by signal SAEB to sense the current in a previous operation. Meanwhile, the discharge signal DS1 and DS2 are both at enabled level (high level for example) so as to pull the voltage of the bit line corresponding to the previous sensed memory cell to the ground voltage.

In a time interval T2, first cell row of the memory unit MU_i is enabled by a row address on the word line WL1' and the Y-multiplexer 26b__i selects the bit line BL4' in response to the selection signal {A3, A2, A1} with a value {0, 1, 1}. Thus, the memory cell C1 is accordingly driven to provide an output current to the sense amplifier 28__i.

Meanwhile, the discharge signal DS2 is at the enable level (high level) in the time interval T2, such that the discharge circuit 30 is enabled in the time interval T2. Furthermore, a memory cell C2, which is a memory cell on the first cell row and on the eighth cell column, and a transistor, which is controlled by the product of the bit data A1 and A0 (that is the product of 1 and 1, i.e. 1) in the Y-multiplexer 26b__i, are also enabled in the time interval T2. Thus, via a discharge path DP, which is formed with the memory cell C2 and the transistor controlled by the product of A1 and A0, the discharge circuit 30 can be used to effectively drive the voltage at the source line SL1' to the ground voltage. Therefore, source side loading effect on the source line SL1' can be effectively eased.

Figure 5:
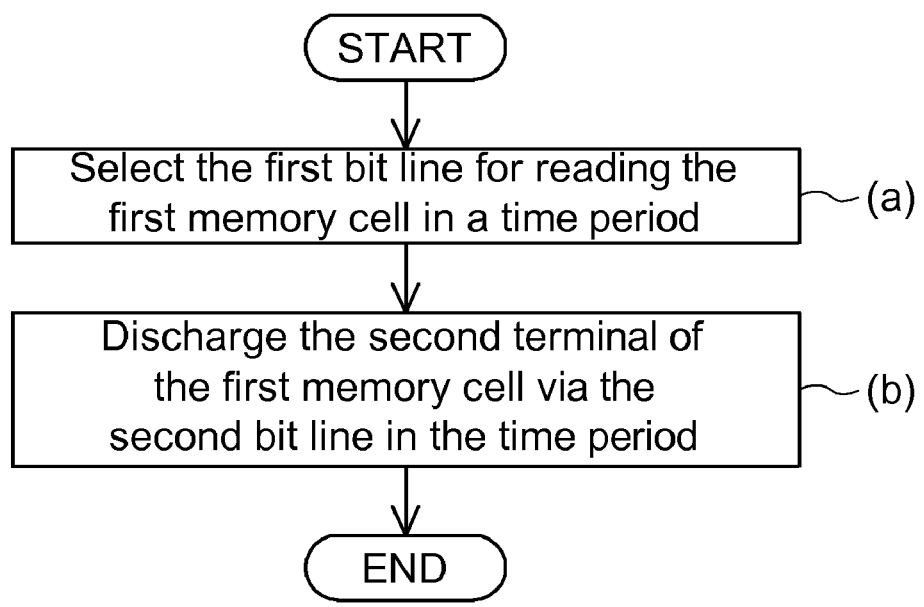
FIG. 5 is a flow chart of the reading method according to the embodiment.

Referring to FIG. 5, a flow chart of the reading method according to the embodiment is shown. The reading method includes the following steps. Firstly performing step (a), the bit line BL4' is selected for reading the memory cell C1 in the time period T2. For example, in the time period T2, the address decoder 22 provides a row address via the word line WL1' to enable the first cell row in the memory unit MU_i. Then a selection signal is provided to the Y-multiplexer 26b__i to accordingly select the memory cell C1. Then sense amplifier 28__i then accordingly performs a read operation on the memory cell C1 in the time period T2.

Next, performing step (b), the second terminal of the memory cell c1 is discharged via the bit line BL8' coupled to the memory cell C2 in the time period T2. For example, in the time period T2, the product of the bit data A0 and A1 is used to enable the corresponding transistor in the Y-multiplexer 26b__i so as to form the discharge path DP with the memory cell C2 and the transistor in the Y-multiplexer 26b__i controlled by the product of the bit data A0 and A1. Thus, in the time period T2, the discharge circuit 30 discharges voltage on the bit line BL8', the sources of the memory cells C2 and C1, and the sour line SL1' to the ground voltage.

Figure 6:
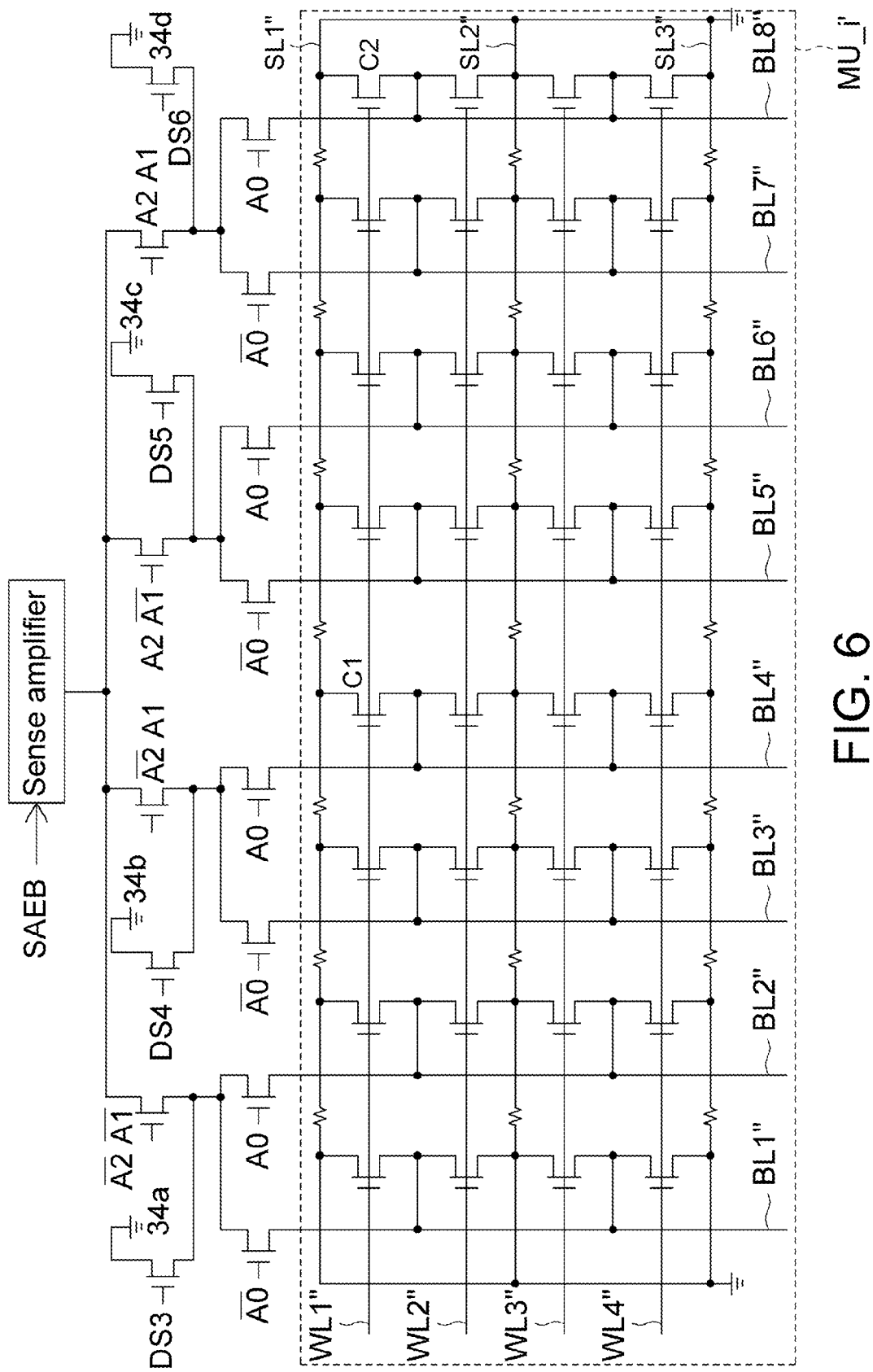
FIG. 6 is another schematic diagram of the $i^{th}$ memory unit MU_i' of the memory array.

Although only the situation that one discharge path is formed in a memory unit, the number of discharge path formed in a memory unit is not limited thereto. In an example, the number of discharge path is relevant to number of discharge circuits corresponding to the memory unit. In other example, as shown in FIG. 6, 4 discharge circuits DS3-DS6 are used for discharging the corresponding bit lines BL1" to BL8" in the memory unit MU_i'. Thus, at most 3 discharge paths can be formed in the memory unit MU_i'.

Although only the read operation performed on the memory cell C1 is cited as an example mentioned above, the read operation performed on other memory cells in the memory unit MU_i can be obtained accordingly. Thus, whenever a memory cell in the memory unit MU_i is read, a discharge path connecting the corresponding source line and one of the discharge devices can be provided so as to pull the voltage at the source line to the ground voltage. Similarly, although only the operation performed on the $i^{th}$ memory unit MU_i of the memory array 20 is cited as an example mentioned above, the operation performed on other memory units can be obtained by analog with the above mentioned operation.

Although only the situation that the memory units MU_i includes one memory block is cited as an example describing above, the number of memory block included the memory unit MU_i is not limited thereto. In other example, the memory unit of the memory array 20 can also include two or more than two memory blocks.

In an example, the above mentioned read operation can be applied in an erase verification operation performed after an erase operation, in which substantially all memory cells in the memory block of the memory unit MU_i are erased with a data value of 1 (that is all memory cells in the memory block have lower threshold voltage). Thus, in the erase verification operation, the memory cell C2 can be effectively turned on in response to the row address on the word line WL1'.

In an example, the above mentioned read operation can be applied in a page read operation, in which a great number of memory cells in the memory array 20 are simultaneously accessed by the corresponding sense amplifiers and a great amount of output current is transmitted on each of the source lines. Thus, by applying the read operation mentioned above, the serious source side loading effect caused by the great amount of output current can be effectively eased.

When a memory cell is read, the reading method of the embodiment uses an address decoder to provide a discharge signal to enable a discharge path to pull down the voltage at a source line, which is corresponds to the read memory cell. A second memory cell, which is situated at a same cell row as the read cell situated, and a bit line corresponding to the second memory cell are incorporated in the discharge path. Therefore, in comparison with the conventional memory, the reading method and memory of the embodiment can effectively ease the source side loading effect happened in the conventional memory, prevent the source voltage, the threshold voltage of each memory cell of the memory array, and the sensed output current from having abnormal variation, and have more accurate sensing result.

Besides, in comparison to the conventional memory, the source side loading effect the memory reading method and memory of the embodiment can also effectively prevent the over-erasure situation from happen since the source side loading effect is effectively eased and the variation of the sensed output current is effectively prevented.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising:
   a memory array, comprising a first memory cell and a second memory cell situated on a selected cell row of the memory array and
   a first bit line and a second bit line respectively coupled to the first and the second memory cells; and
   a discharge circuit for discharging a first terminal of the first memory cell via the second bit line when the first memory cell is read.

2. The memory according to claim 1, further comprising:
   an address decoder, enabling the selected cell row in response to a row address, and providing a selection signal and a discharge signal in a time period; and
   a Y-multiplexer, connecting the second bit line to the discharge circuit in response to the selection signal, so that the discharge circuit discharges the second bit line in response to the discharge signal.

3. The memory according to claim 2, further comprising:
   a sense amplifier, wherein:
   the Y-multiplexer further connects the first bit line to the sense amplifier in response to the selection signal for reading the data stored in the first memory cell.

4. The memory according to claim 2, wherein the discharge circuit comprises a transistor having a first terminal coupled to a ground voltage, a second terminal coupled to the second bit line, and a control terminal receiving the discharge signal.

5. The memory according to claim 1, wherein:
   the memory array comprises a plurality of memory units, and each of the memory units comprises a plurality of memory blocks; and
   the first and the second memory cells are situated in a same memory block of a same memory unit in the memory array.

6. The memory according to claim 1, wherein the first terminal of the first memory cell is a source side of the first memory cell.

7. A reading method for a memory, the memory comprising a cell row, the cell row comprising a first memory cell coupled to a first bit line, and a second memory cell coupled to a second bit line, the reading method comprising:
   selecting the first bit line coupled to a first terminal of the first memory cell for reading the first memory cell in a time period; and
   discharging the second terminal of the first memory cell via the second bit line coupled to the second memory cell in the time period.

8. The reading method according to claim 7, wherein the step of discharging the second terminal of the first memory cell further comprises:
   enabling the second memory cell, which short-connects the second bit line to the second terminal of the first cell in response to a row address;
   connecting the second bit line to a discharge circuit in response to a selection signal; and
   enabling the discharge circuit to discharge the voltage on the second terminal of the first memory cell to a ground voltage in response to a discharge signal.

9. The reading method according to claim 8, wherein the step of selecting the first bit line further comprises:
   enabling the first memory cell; and
   outputting data stored in the first memory cell to a sense amplifier so as to read the first cell in response to the selection signal.

* * * * *